United States Patent
Bosnyak et al.

(10) Patent No.: US 9,475,921 B2
(45) Date of Patent: *Oct. 25, 2016

(54) NANOPLATE-NANOTUBE COMPOSITES, METHODS FOR PRODUCTION THEREOF AND PRODUCTS OBTAINED THEREFROM

(75) Inventors: Clive P. Bosnyak, Dripping Springs, TX (US); Kurt W. Swogger, Austin, TX (US)

(73) Assignee: Molecular Rebar Design, LLC, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/128,350

(22) PCT Filed: Jun. 21, 2012

(86) PCT No.: PCT/US2012/043533
§ 371 (c)(1),
(2), (4) Date: Dec. 20, 2013

(87) PCT Pub. No.: WO2012/177864
PCT Pub. Date: Dec. 27, 2012

(65) Prior Publication Data
US 2014/0127511 A1    May 8, 2014

Related U.S. Application Data

(60) Provisional application No. 61/500,562, filed on Jun. 23, 2011.

(51) Int. Cl.
*C01B 31/04* (2006.01)
*C08K 9/02* (2006.01)
(Continued)

(52) U.S. Cl.
CPC .............. *C08K 9/02* (2013.01); *A47D 13/10* (2013.01); *B01J 21/185* (2013.01); *B01J 35/06* (2013.01); *B01J 37/0201* (2013.01); *B01J 37/0236* (2013.01); *B01J 37/343* (2013.01); *B82Y 30/00* (2013.01); *B82Y 40/00* (2013.01);
(Continued)

(58) Field of Classification Search
USPC ........................................................ 524/445
See application file for complete search history.

(56) References Cited

U.S. PATENT DOCUMENTS

| 2003/0096104 A1 | 5/2003 | Tobita et al. |
| 2005/0006623 A1 | 1/2005 | Wong et al. |

(Continued)

FOREIGN PATENT DOCUMENTS

| CN | 101734650 A | * | 6/2010 |
| CN | 101811690 B | | 2/2012 |

(Continued)

OTHER PUBLICATIONS

English Translation of CN 101734650 A obtained Jun. 3, 2014 at http://translationportal.epo.org/emtp/translate/?ACTION=descriptionretrieval&COUNTRY=CN&ENGINE=google&FORMAT=docdb&KIND=A& LOCALE=en_EP&NUMBER=101734650&OPS=cn.espacenet.com/ops&SRCLANG=zh&TRGLANG=.*

(Continued)

*Primary Examiner* — Ling Choi
*Assistant Examiner* — Lanee Reuther
(74) *Attorney, Agent, or Firm* — Andrews Kurth LLP

(57) ABSTRACT

Compositions and methods of producing discrete nanotubes and nanoplates and a method for their production. The discrete nanotube/nanoplate compositions are useful in fabricated articles to provide superior mechanical and electrical performance. They are also useful as catalysts and catalyst supports for chemical reactions.

10 Claims, 3 Drawing Sheets

(51) Int. Cl.

| | |
|---|---|
| A47D 13/10 | (2006.01) |
| H01G 11/36 | (2013.01) |
| C09C 1/44 | (2006.01) |
| H01L 31/0352 | (2006.01) |
| C04B 35/628 | (2006.01) |
| C04B 40/00 | (2006.01) |
| C01B 31/02 | (2006.01) |
| B01J 37/02 | (2006.01) |
| B01J 37/34 | (2006.01) |
| B01J 21/18 | (2006.01) |
| B01J 35/06 | (2006.01) |
| B82Y 30/00 | (2011.01) |
| B82Y 40/00 | (2011.01) |
| B01J 37/00 | (2006.01) |
| H01M 4/62 | (2006.01) |

(52) U.S. Cl.
CPC ...... C01B 31/0273 (2013.01); C01B 31/0484 (2013.01); C04B 35/62839 (2013.01); C04B 35/62889 (2013.01); C04B 35/62892 (2013.01); C04B 40/0039 (2013.01); C09C 1/44 (2013.01); H01G 11/36 (2013.01); H01L 31/035218 (2013.01); B01J 37/009 (2013.01); B01J 37/0018 (2013.01); C01P 2004/04 (2013.01); C01P 2004/13 (2013.01); C01P 2004/24 (2013.01); C01P 2004/54 (2013.01); C04B 2235/3203 (2013.01); C04B 2235/3244 (2013.01); C04B 2235/3272 (2013.01); C04B 2235/425 (2013.01); C04B 2235/447 (2013.01); C04B 2235/5288 (2013.01); C04B 2235/5292 (2013.01); H01M 4/625 (2013.01); Y02E 60/13 (2013.01); Y10T 428/2982 (2015.01)

(56) References Cited

U.S. PATENT DOCUMENTS

| | | | |
|---|---|---|---|
| 2005/0106093 | A1 | 5/2005 | Iijima et al. |
| 2006/0024503 | A1* | 2/2006 | Wong ............... B82B 1/00 428/408 |
| 2006/0286456 | A1 | 12/2006 | Fu et al. |
| 2007/0125707 | A1 | 6/2007 | Komatsu et al. |
| 2007/0215841 | A1 | 9/2007 | Ford et al. |
| 2007/0280876 | A1 | 12/2007 | Tour et al. |
| 2008/0090951 | A1 | 4/2008 | Mao et al. |
| 2008/0220148 | A1 | 9/2008 | Clarkson et al. |
| 2008/0290007 | A1 | 11/2008 | Fagan et al. |
| 2008/0299374 | A1 | 12/2008 | Choi et al. |
| 2009/0311489 | A1 | 12/2009 | Sheehan et al. |
| 2010/0004468 | A1 | 1/2010 | Wong et al. |
| 2010/0215724 | A1 | 8/2010 | Prakash et al. |
| 2010/0324315 | A1 | 12/2010 | Atyabi et al. |
| 2011/0017921 | A1 | 1/2011 | Jiang et al. |
| 2011/0210282 | A1* | 9/2011 | Foley ............... 252/62.51 R |
| 2011/0311876 | A1 | 12/2011 | Sturgeon et al. |

FOREIGN PATENT DOCUMENTS

| | | |
|---|---|---|
| CN | 101734650 B | 6/2012 |
| EP | 1665446 | 3/2012 |
| EP | 1665446 B1 | 3/2012 |
| JP | 2006240901 A | 9/2006 |
| JP | 2007516314 | 6/2007 |
| JP | 2009534284 | 9/2009 |
| WO | 2004106420 A1 | 12/2004 |
| WO | 2005014708 A1 | 2/2005 |
| WO | 2006096613 A1 | 9/2006 |
| WO | 2007119231 A1 | 10/2007 |
| WO | 2008011623 A1 | 1/2008 |
| WO | 2008051239 A1 | 5/2008 |
| WO | 2008153609 A1 | 12/2008 |
| WO | 2009/155267 | 12/2009 |
| WO | 2009155267 A1 | 12/2009 |
| WO | 2010117392 A1 | 10/2010 |
| WO | WO 2010117392 A1 * | 10/2010 |
| WO | 2011/002222 | 1/2011 |
| WO | 2011002222 A2 | 1/2011 |
| WO | 2012/083358 | 6/2012 |
| WO | 2012083358 A1 | 6/2012 |
| WO | 2013/011516 | 1/2013 |
| WO | 2013011516 A1 | 1/2013 |

OTHER PUBLICATIONS

Definition of Organic, in "Organic Chemistry" by Thomas N. Sorrell, Second Edition, 2006, University Science Books, Chapter 1, p. 1.*

Definition of "intersperse" obtained at http://www.collinsdictionary.com/dictionary/english/intersperse on Sep. 11, 2014.*

European Patent Office, International Search Report and Written Opinion, PCT Application No. PCT/US2012/043533, Nov. 28, 2012.

European Patent Office, Response to Written Opinion and Demand, PCT Application No. PCT/US2012/043533, Apr. 23, 2013.

European Patent Office, International Preliminary Report on Patentability, PCT Application No. PCT/US2012/043533, Jun. 26, 2013.

European Patent Office, Office Action, European Application No. 12 738 267.9, Dec. 5, 2014, 4 pages.

Translation of Japanese Office Action (No. 2014-517156). dated Jan. 5, 2016.

Spitalsky, Z., et al., "High Volume Fraction Carbon Nanotube-Epoxy Composites", Nanotechnology, vol. 20, No. 40, Oct. 7, 2009.

Kim, Hee-Cheul, et al., "The Effect of Different Treatment Methods of Multiwalled Carbon Nanotubes on Thermal and Flexural Properties of Their Epoxy Nanocomposites", Journal of Polymer Science: Part B: Polymer Physics, vol. 48, No. 11, Jun. 1, 2010.

Hadjiev, V.G., et al., "Raman Microscopy of Residual Strains in Carbon Nanotube/Epoxy Composites", Carbon, vol. 48, No. 6, May 1, 2010.

Lee, J.H., et al., "Effects of Moisture Absorption and Surface Modification Using 3-Aminopropyltriethoxysilane on the Tensile and Fracture Characteristics of MWCNT/EPOXY Nanocomposites", Applied Surface Science, vol. 256, No. 24, Jun. 15, 2010.

Zhu, Jiang, et al., "Improving the Dispersion and Integration of Single-Walled Carbon Nanotubes in Epoxy Composites Through Functionalization", Nano Letters, vol. 3, No. 8, Aug. 1, 2003.

Liu, L., et al., "Rubbery and Glassy Epoxy Resins Reinforced With Carbon Nanotubes", Composites Science and Technology, vol. 65, No. 11-12, Sep. 1, 2005.

Chen, Wei, et al., "Carbon Nanotube-Reinforced Polyurethane Composite Fibers", Composites Science and Technology, vol. 66, No. 15, Dec. 1, 2006.

Bhatiacharyya, Sanjib, et al., "Improving Reinforcement of Natural Rubber by Networking of Activated Carbon Nanotubes", Carbon, vol. 46, No. 7, Jun. 1, 2008.

Shanmugharaj, A.M., et al., "Physical and Chemical Characteristics of Multiwalled Carbon Nanotubes Functionalized with Aminosilane and Its Influence on the Properties of Natural Rubber Composites", Composites Science and Technology, vol. 67, No. 9, Mar. 24, 2007.

Wu, Guoliang, et al., "Preparation and Properties of Hydroxylated Styrene-Butadiene-Styrene Tri-Block Copolymermulti-walled Carbon Nanotubes Nanocomposites via Covalent Bond", Materials Science and Engineering; vol. 527, No. 20, May 6, 2010.

Sui, G., et al., "Curing Kinetics and Mechanical Behavior of Natural Rubber Reinforced with Pretreated Carbon Nanotubes", Materials Science and Engineering, vol. 485, No. 1-2, Jun. 25, 2008.

Barroso-Bujans, F., et al., "Effects of Functionalized Carbon Nanotubes in Peroxide Crosslinking of Diene Elastomers", European Polymer Journal, vol. 45, No. 4, Apr. 1, 2009.

(56) References Cited

OTHER PUBLICATIONS

Zhou, Xiang-Wen, et al., "Preparation and Properties of Powder Styrene-Butadiene Rubber Composites Filled With Carbon Black and Carbon Nanotubes", Materials Research Bulletin, vol. 42, No. 3, Feb. 22, 2007.

Vast, L., et al., "Preparation and Electrical Characterization of a Silicone Elastomer Composite Charged With Multi-Wall Carbon Nanotubes Functionalized With 7-Octenyltrichlorosilane", Composites Science and Technology, vol. 67, No. 5, Jan. 18, 2007.

Broza, Georg, et al., "Thermoplastic Elastomers With Multi-Walled Carbon Nanotubes: Influence of Dispersion Methods on Morphology", Composites Science and Technology; vol. 70, No. 6, Jun. 1, 2010.

Chen, Shuguo, et al., "Thermal Degradation Behavior of Hydrogenated Nitrile-Butadiene Rubber (HNBR)/Clay Nanocomposite and HMBR/Clay/Carbon Nanotubes Nanocomposites", Thermochimica Acta; vol. 491, No. 1-2, Jul. 20, 2009.

Bokobza, "Multiwall Carbon Nanotube Elastomeric Composites; A Review", Polymer, vol. 48, No. 17, Aug. 3, 2007.

Aviles et al. "Evaluation of Mild Acid Oxidation Treatments for MWCNT Functionalization", 47(13) Carbon (Nov. 1, 2009), pp. 2970-2975.

Liu et al., "Fullerene Pipes" 280 Science (2009), pp. 1253-1256.

Tchoul et al., "Effect of Mild Nitric Acid Oxidation on Dispersability, Size and Structure of Single-Walled Carbon Nanotubes", 19(23) Chem. of Materials (2007), pp. 5765-5772.

Zhang et al., Effect of Chemical Oxidation on the Structure of Single-Walled Carbon Nanotubes, 107(16) J. Phys. Chem. B (2003), pp. 3712-3718.

Xing et al., "Sonochemical Oxidation of Multiwalled Carbon Nanotubes", 21 Langmuir (2005), pp. 4185-4190.

* cited by examiner

NANOPLATE-NANOTUBE COMPOSITES, METHODS FOR PRODUCTION THEREOF AND PRODUCTS OBTAINED THEREFROM

This application claims priority to U.S. Provisional Patent Application Ser. No. 61/500,562, entitled "GRAPHENE-CARBON NANOTUBE COMPOSITES, METHODS FOR PRODUCTION THEREOF AND PRODUCTS OBTAINED THEREFROM." filed on Jun. 23, 2011, the entire content of which is hereby incorporated by reference.

FIELD OF THE INVENTION

The present invention is directed to compositions and methods of producing nanoplates and nanotubes.

BACKGROUND

The present invention relates to a composition of nanoplates and nanotubes wherein at least a portion of the nanoplates have at least one nanotube interspersed between two nanoplates. In particular, is described the exfoliation and dispersion of carbon nanotubes and graphene structures resulting in high aspect ratio, surface-modified carbon nanotube/graphene compositions that are readily dispersed in various media. Graphene structures here is meant to include graphene and oxygenated graphene structures. The carbon nanotubes here is meant to include carbon nanotubes and oxidized carbon nanotubes. The oxygenated structures of carbon nanotubes or graphene include, but are not limited to, carboxylic acid, amide, glycidyl and hydroxyl groups attached to the carbon surface.

These nanoplate-nanotube mixtures can be further modified by surface active or modifying agents. This invention also relates to nanoplate-nanotube composites with materials such as elastomers, thermosets, thermoplastics, ceramics and electroactive or photoactive materials. The graphene-carbon nanotube compositions are also useful as catalysts for chemical reactions. Also, the present invention pertains to methods for production of such composites in high yield.

Carbon nanotubes in their solid state are currently produced as agglomerated nanotube bundles in a mixture of chiral or non-chiral forms. Various methods have been developed to debundle or disentangle carbon nanotubes in solution. For example, carbon nanotubes may be shortened extensively by aggressive oxidative means and then dispersed as individual nanotubes in dilute solution. These tubes have low aspect ratios not suitable for high strength composite materials. Carbon nanotubes may also be dispersed in very dilute solution as individuals by sonication in the presence of a surfactant. Illustrative surfactants used for dispersing carbon nanotubes in solution include, for example, sodium dodecyl sulfate and PLURONICS. In some instances, solutions of individualized carbon nanotubes may be prepared from polymer-wrapped carbon nanotubes. Individualized single-wall carbon nanotube solutions have also been prepared in very dilute solutions using polysaccharides, polypeptides, water-soluble polymers, nucleic acids, DNA, polynucleotides, polyimides, and polyvinylpyrrolidone. The dilution ranges are often in the mg/liter ranges and not suitable for commercial usage.

If graphene is exfoliated, i.e., with the individual plates separated rather than stacked, in medium such as water, the thermodynamic energies due to incompatibility and the very high surface area of the graphene results in the plates recombining, and the plates become very difficult to separate into individual plates. Likewise, if graphene plates are to be oxidized, if the plates are bundled, then only the edges of the graphene are readily accessible for reaction.

In the present invention, discrete tubes ranging in diameter from a nanometer to 100 nanometers can be inserted between inorganic plates. In particular, carbon nanotubes can be inserted between graphene plates thus restricting their agglomeration and facilitating exfoliation in a broad range of materials including liquids and solids. Furthermore, as the plates are now separated, reactions can be entertained at the surface of the graphene plates to give, for example, oxygenated graphene structures. The diameter of the tubes can be used to control the inter plate distance. Selecting tubes of different diameters can lead to controlled transport of molecules or ions between the plates.

In view of the foregoing, nanoplate-discrete nanotube compositions and methods for obtaining them are of considerable interest in the art. A number of uses for discrete nanotube/single inorganic plates, particularly carbon nanotube/graphene compositions, are proposed including, for example, energy storage devices (e.g., ultracapacitors, supercapacitors and batteries), field emitters, conductive films, conductive wires, photoactive materials, drug delivery and membrane filters. Use of discrete carbon nanotube/graphene compositions as a reinforcing agent in material composites is another area which is predicted to have significant utility. Materials include, for example, polymers, ceramics, rubbers, cements. Applications include tires, adhesives, and engineered structures such as windblades, aircraft and the like.

SUMMARY

One embodiment of this invention includes a composition comprising inorganic plates with individual plate thickness less than 10 nanometers, termed nanoplates, interspersed with at least a portion of discrete nanotubes of diameter ranging from about 1 nanometer to 150 nanometers and aspect ratio about 10 to 500. Preferably the inorganic plates are graphene and the discrete nanotubes are carbon nanotubes. The range of weight ratio of inorganic plates to nanotubes is about 1:100 to 100:1. The mixture of nanoplates and nanotubes may further comprise a polymer selected from the group consisting of thermoplastics, thermosets and elastomers and/or inorganic materials selected from the group consisting of ceramics, clays, silicates, metal complexes and salts. Also preferably, the discrete carbon nanotube fibers have an aspect ratio of from about 25 to about 500, and oxidation level of from about 1 weight % to about 15 weight %.

A further embodiment of this invention includes a mixture of nanoplates and nanotubes which may further comprise at least one electroactive material, which may be useful, for example, in an energy storage device or photovoltaic.

A yet further embodiment of this invention is a composition of nanoplates and nanotubes further comprising at least one transition metal complex or active catalyst species. An active catalyst can be ionically, or covalently attached to the discrete nanotubes, or inorganic plates or combinations thereof. The chemical reactions can involve contact of the composition with, for example, but not limited to, alkenes and alkynes, chemical moieties containing oxygen, chemical moieties containing nitrogen, chemical moieties containing halogen, and chemical moieties containing phosphorous. The composition may be in the form of a powder for gas phase reaction or in the form of a liquid mixture for solution and slurry phase reactions.

Another embodiment of this invention is a method for preparing graphene carbon nanotube composites, said method comprising: a) suspending non-discrete graphene and non-discrete carbon nanotube fibers in an acidic solution for a time period; b) optionally agitating said suspension; c) sonically treating said suspension of graphene-carbon nanotubes to form graphene-discrete carbon nanotube fibers; and d) isolating the resultant graphene-discrete carbon nanotube composition from the acid prior to further treatment using solid/liquid separations, wherein said separations comprise filtration.

Another embodiment of this invention is a method for preparing inorganic plate-carbon nanotube composites, said method comprising: a) suspending non-discrete carbon nanotube fibers in an acidic solution for a time period, b) sonically treating said suspension of carbon nanotubes to form discrete carbon nanotube fibers, c) isolating the resultant oxidized discrete carbon nanotube composition from the acid, d) washing the oxidized discrete carbon nanotubes with water or other liquids to remove acid, e) redispersing the discrete oxidized carbon nanotubes with inorganic plates, optionally with surfactants and sonication, f) optionally adding a polymer, g) optionally adding a transition metal complex, h) optionally adding an electroactive material, i) optionally adding a ceramic, j) separating the mixture and optionally drying.

A further embodiment of this invention is the composition nanoplates and nanotubes in the form of a part of a fabricated article such as a tire, industrial rubber part or wind blade. The compositions are also useful for batteries, capacitors, photovoltaics catalysts and catalyst supports. Further utility is envisioned, but not limited to, membranes, conductive inks, sensors and static management and electromagnetic shielding.

BRIEF DESCRIPTION OF THE DRAWINGS

For a more complete understanding of the present disclosure, and the advantages thereof, reference is now made to the following descriptions to be taken in conjunction with the accompanying figures for describing specific embodiments of the disclosure, wherein.

DETAILED DESCRIPTION

Figure 1:
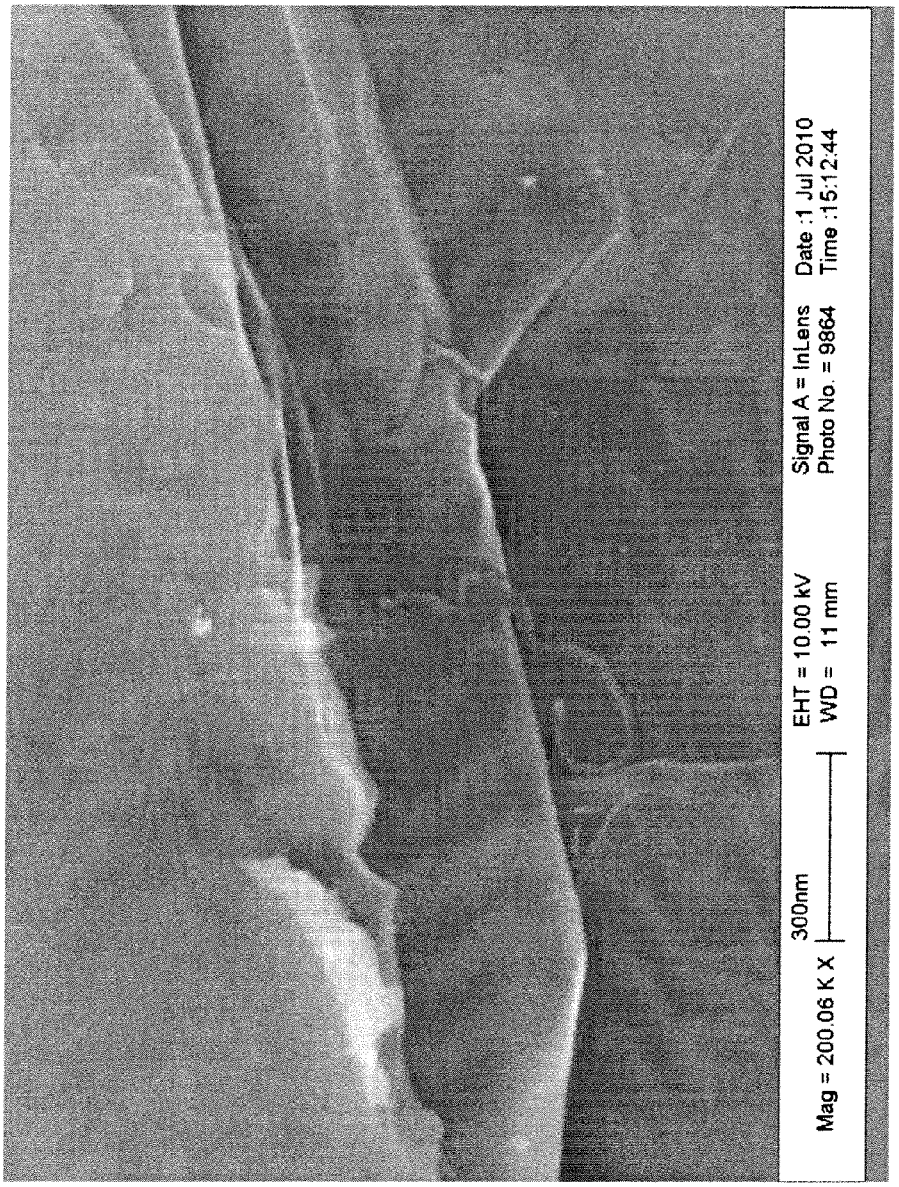
FIG. 1 shows a secondary electron micrograph of graphene plates with a discrete carbon nanotube of this invention. The magnification is 200,000×.

In the following description, certain details are set forth such as specific quantities, sizes, etc., so as to provide a thorough understanding of the present embodiments disclosed herein. However, it will be evident to those of ordinary skill in the art that the present disclosure may be practiced without such specific details. In many cases, details concerning such considerations and the like have been omitted inasmuch as such details are not necessary to obtain a complete understanding of the present disclosure and are within the skills of persons of ordinary skill in the relevant art.

While most of the terms used herein will be recognizable to those of ordinary skill in the art, it should be understood, however, that when not explicitly defined, terms should be interpreted as adopting a meaning presently accepted by those of ordinary skill in the art. In cases where the construction of a term would render it meaningless or essentially meaningless, the definition should be taken from Webster's Dictionary, 3rd Edition, 2009. Definitions and/or interpretations should not be incorporated from other patent applications, patents, or publications, related or not, unless specifically stated in this specification or if the incorporation is necessary for maintaining validity.

Nanotubes are tubular structures that have a diameter of at least 1 nanometer and up to 100 nanometers. Examples of nanotubes are single, double and multiwall carbon nanotubes or titanium dioxide nanotubes. The aspect ratio is defined as the ratio of the tube length to the tube diameter. Nanoplates are defined as being discernible plates of thickness less than ten nanometers.

Discrete oxidized carbon nanotubes, alternatively termed exfoliated carbon nanotubes, can be obtained from as-made bundled carbon nanotubes by methods such as oxidation using a combination of concentrated sulfuric and nitric acids. The bundled carbon nanotubes can be made from any known means such as, for example, chemical vapor deposition, laser ablation, and high pressure carbon monoxide synthesis. The bundled carbon nanotubes can be present in a variety of forms including, for example, soot, powder, fibers, and bucky paper. Furthermore, the bundled carbon nanotubes may be of any length, diameter, or chirality. Carbon nanotubes may be metallic, semi-metallic, semi-conducting, or non-metallic based on their chirality and number of walls. The discrete oxidized carbon nanotubes may include, for example, single-wall, double-wall carbon nanotubes, or multi-wall carbon nanotubes and combinations thereof.

Graphene is an allotrope of carbon, whose structure is one-atom-thick planar sheets of $sp^2$-bonded carbon atoms that are densely packed in a honeycomb crystal lattice. The crystalline or "flake" form of graphite consists of many graphene sheets stacked together. Graphene sheets stack to form graphite with an interplanar spacing of 0.335 nm. Graphene is the basic structural element of some carbon allotropes including graphite, charcoal, carbon nanotubes and fullerenes. It can also be considered as an indefinitely large aromatic molecule, the limiting case of the family of flat polycyclic aromatic hydrocarbons. One method for graphene obtainment consists of mixing low concentrations of graphite in a solvent such as N-methylpyrrolidone then sonicating. Non-exfoliated graphite is eventually separated from graphene by centrifugation.

One of ordinary skill in the art will recognize that many of the specific aspects of this invention illustrated utilizing a particular type of nanotube or nanoplate may be practiced equivalently within the spirit and scope of the disclosure utilizing other types of nanotubes and nanoplates.

Example 1

Evaluation of Discrete Carbon Nanotubes and Graphene Dispersion Characteristics in Surfactant-Stabilized Aqueous Suspensions Graphene (Rice University) and multiwall carbon nanotubes (C-9000, C-Nano) of diameter about 13 nm and are combined in the weight ratio of 1:3, respectively. A 1% w/v dispersion of the mixture is prepared in a 3:1 sulfuric (96%, KMG)/nitric (70%, Honeywell) acid solution and sonicated using a sonicator bathe while maintaining a bath temperature in the 30° C.-35° C. range for 3 hours. Following sonication, each formulation was Büchner-filtered on a 5 μm PVDF membrane (Whatman) with a 200 mL portion of water. The samples were dried for two hours at 80° C. in a vacuum oven. An electron micrograph will show carbon nanotubes separating graphene plates, for example shown in FIG. 1.

0.05 g of the dried graphene carbon nanotube mixture and 0.15 g of sodium dodecyl sulfate (Sigma-Aldridge) was added to a 20 mL graduated flask and filled to the 20 mL mark with water. The flask was sonicated in a bath for a period of 1 hour, the temperature monitored in the same fashion described above. After sonication, a 1 mL sample was diluted with water to final total carbon concentration of $2.5 \times 10^{-5}$ g/mL and evaluated by UV-vis spectrophotometry (BioSpec-1601, Shimadzu). Following the measurement of the first absorbance spectrum, the same specimen was analyzed at 5, 15, 30, 45 and 60-minute time periods at a wavelength of 500 nm to evaluate the stability of the mixture in water. The decay in initial absorbance value at 500 nm after 60 minutes was determined as 0.4%.

Comparison 1

Comparison 1 repeats the experimental procedure as example 1 but with graphene only. The decay in initial absorbance value at 500 nm after 60 minutes was determined as 12.1%.

Comparison 2

Comparison 2 repeats the experimental procedure as example 1 but with multiwall carbon nanotubes only. The decay in initial absorbance value at 500 nm after 60 minutes was determined as 0%.

The discrete carbon nanotubes of example 1 are shown by the UV spectroscopy to have provided stability to the graphene dispersions by interspersing between the graphene plates.

Example 2

Figure 2:
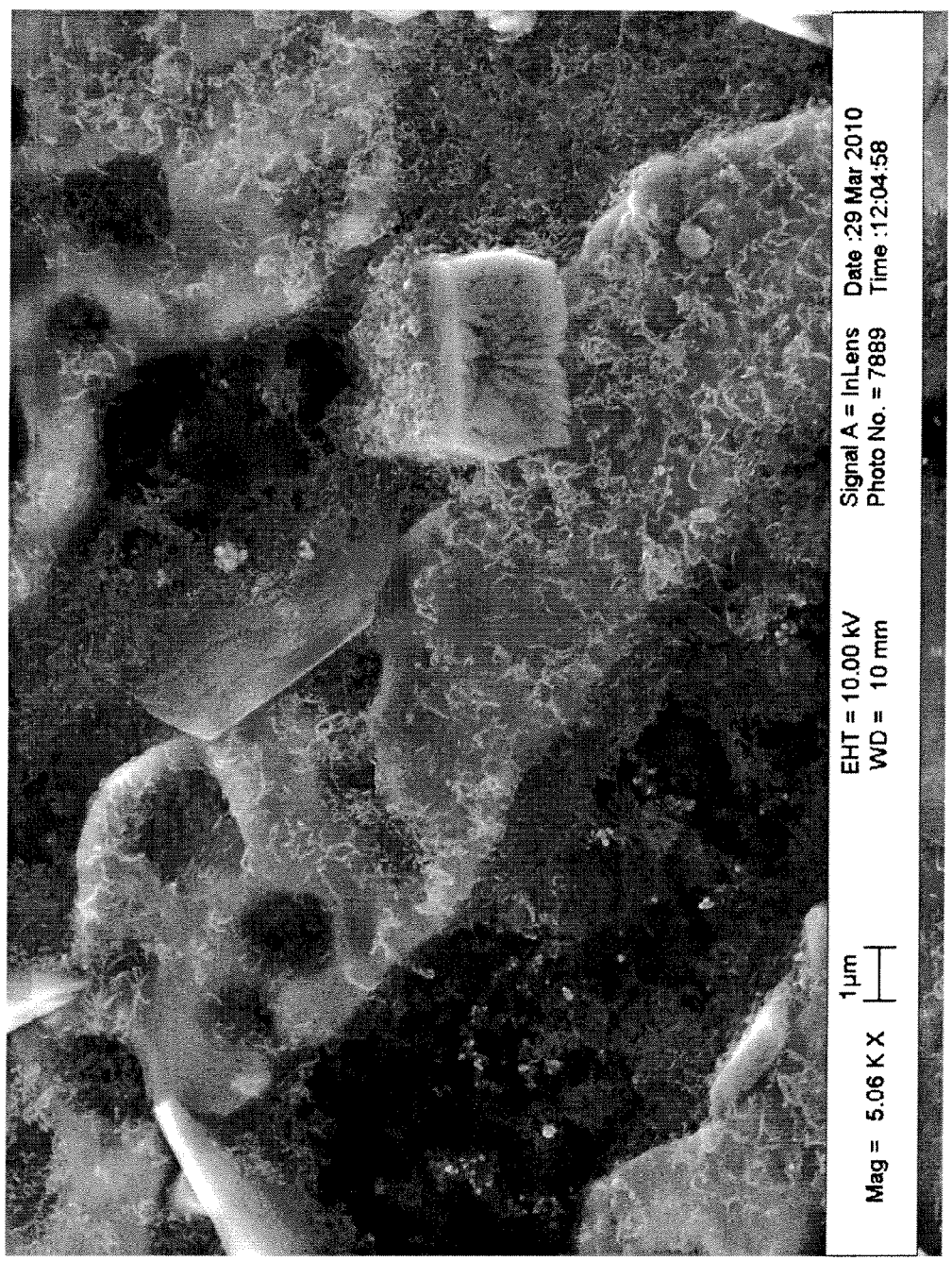
FIG. 2 shows a secondary electron micrograph of lithium iron phosphate and magnesium hydroxide plates with a discrete carbon nanotube of this invention. The magnification is 5,060×.

0.039 grams of multiwall carbon nanotubes with an oxidation level of 8 weight percent is added to 0.0401 grams of lithium iron phosphate and 40 grams of deionized water in a glass bottle. The mixture is sonicated for 13 minutes using a sonicator bath at 25 degrees centigrade, after which no carbon nanotube particles are observed by visual inspection. 1 ml of the sonicated mixture is then mixed with 0.14 mls of a 0.1% weight/volume mixture of magnesium hydroxide in deionized water and then diluted with more deionized water so that the volume was 4 ml. This final mixture was sonicated a further 15 minutes at 25 degrees centigrade. For examination by electron microscopy a drop of this solution is then placed on a carbon tape and dried. The result is seen in FIG. 2 showing discrete carbon nanotubes on the surface and between plates.

Example 3

Figure 3:
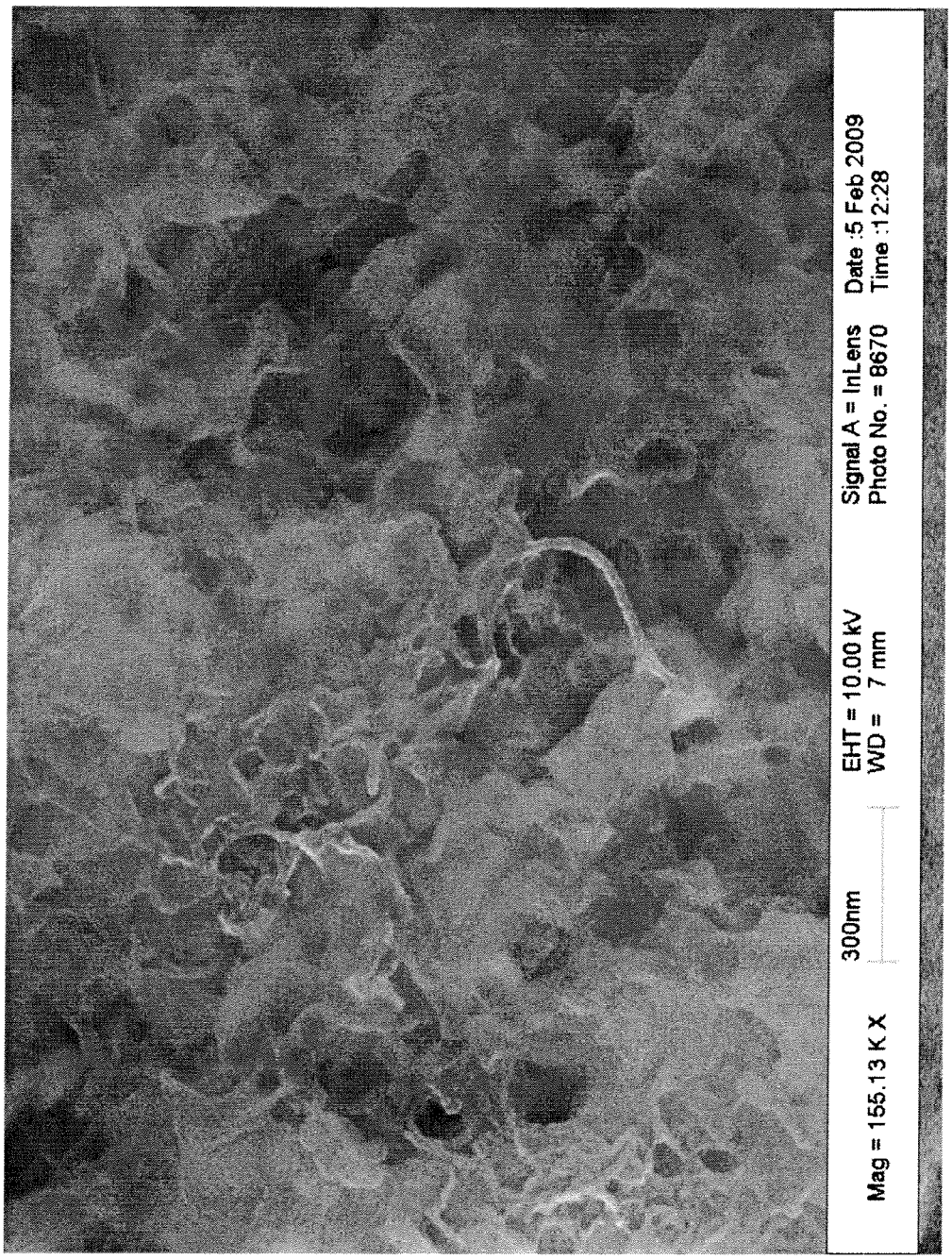
FIG. 3 shows a secondary electron micrograph of zirconium phosphate plates with discrete carbon nanotube of this invention. The magnification is 155,000×.

Discrete Multiwall Carbon Nanotubes with Zirconium Phosphate Nanoplates, $Zr(HPO_4)2H_2O$ A dispersed solution of carbon nanotubes was prepared from 10 mg of multi-wall carbon nanotubes placed in 2 mL of a mixture of $Zr(HPO_4)2.H_2O$ and tetrabutylammonium hydroxide (5 weight % $Zr(HPO_4).H_2O$; 1:0.8 ratio of $Zr(HPO_4)2H_2O$:tetrabutylammonium hydroxide). The solution was subsequently diluted to 30 mL and then sonicated for 2 hours. The solution is stable for at least 24 hours. A drop of this solution is placed on a carbon tape and dried. The secondary electron microscope picture, FIG. 3, reveals zirconium phosphate nanoplates of approximate plate diameter of 200 nanometers interspersed with discrete carbon nanotubes.

The invention claimed is:

1. A composition comprising:
   inorganic plates with individual plate thickness of less than 10 nanometers;
   wherein the inorganic plates are interspersed with carbon nanotubes consisting essentially of discrete exfoliated carbon nanotubes between the inorganic plates, the carbon nanotubes having a diameter ranging from about 1 nanometer to 150 nanometers, an oxidation level of from about 1 weight % to about 15 weight %, and the carbon nanotubes having an aspect ratio ranging from about 10 to 500, and wherein the inorganic plates are discernible graphene nanoplates.

2. The composition of claim 1, wherein the inorganic plates and discrete tubes are present at a weight ratio of about 1:100 to 100:1.

3. The composition of claim 1, further comprising a polymer selected from the group consisting of: thermoplastics, thermosets and elastomers.

4. The composition of claim 1, further comprising inorganic materials selected from the group consisting of: ceramics, clays, silicates, metal complexes and salts.

5. The composition of claim 1 further comprising at least one electroactive material.

6. The composition of claim 1 further comprising at least one transition metal complex or active catalyst species.

7. The composition of claim 1, wherein the carbon nanotubes have an aspect ratio ranging from about 25 to 500.

8. The composition of claim 7, wherein the inorganic plates and discrete tubes are present at a weight ratio of about 1:100 to 100:1.

9. The composition of claim 7, further comprising a polymer selected from the group consisting of: thermoplastics, thermosets and elastomers.

10. The composition of claim 1, wherein the graphene nanoplates and carbon nanotubes are oxidized.

* * * * *